United States Patent
Hu et al.

(10) Patent No.: US 7,211,463 B2
(45) Date of Patent: May 1, 2007

(54) PROCESS TO IMPROVE CARRIER MOBILITY OF ORGANIC SEMICONDUCTOR

(75) Inventors: Tarng-Shiang Hu, Hsinchu (TW); Jia-Chong Ho, Taipei (TW); Liang-Ying Huang, Taichung (TW); Wei-Ling Lin, Nantou (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/948,341

(22) Filed: Sep. 24, 2004

(65) Prior Publication Data

US 2006/0052195 A1    Mar. 9, 2006

(30) Foreign Application Priority Data

Sep. 3, 2004    (TW)    .............................. 93124136 A

(51) Int. Cl.
*H01L 51/40*    (2006.01)
*H01L 21/84*    (2006.01)

(52) U.S. Cl. .................. 438/99; 438/151; 257/E51.007

(58) Field of Classification Search .................. 438/99, 438/151

See application file for complete search history.

(56) References Cited

U.S. PATENT DOCUMENTS 6,433,359 B1 *    8/2002    Kelley et al. .................. 257/40

* cited by examiner

*Primary Examiner*—Alexander Ghyka
(74) *Attorney, Agent, or Firm*—Akin Gump Strauss Hauer & Feld LLP

(57) ABSTRACT

The invention related to a process for improving carrier mobility of organic semiconductor, comprising the steps of: forming a gate on a substrate; forming an insulator layer on the substrate and the gate; coating polyimide on the insulator layer to form an interlayer; forming an active layer on the interlayer; and forming a source and a drain.

15 Claims, 4 Drawing Sheets

PROCESS TO IMPROVE CARRIER MOBILITY OF ORGANIC SEMICONDUCTOR

FIELD OF THE INVENTION

The invention relates to a process for improving carrier mobility of organic semiconductor, and more particularly, to a process capable of improving carrier mobility of organic semiconductor by adding an interlayer to an organic thin film transistor (OTFT).

BACKGROUND OF THE INVENTION

An organic thin film transistor (OTFT) is made of organic conjugated polymer or oligoanolone. Compared with a conventional non-organic transistor, the OTFT can be constructed at a lower temperature, and thus the substrate of the OTFT can be a plastic substrate which is lighter, thinner and cheaper than the glass substrate of the conventional non-organic transistor. In addition, the organic thin film transistor can employ a simpler manufacture process that doesn't require certain high precision technique and equipment. In this regard, the OTFT are of great potential and interest for further development. Although the organic thin film transistor has the advantages as described above, there are still some bottlenecks choking the further research, such as low carrier mobility and high driving voltage. The low carrier mobility limits the development and application of OTFT. In general, as the active layer is made of crystalline silicon whose the orientation of each molecular is not the same, a boundary is formed between two different crystal systems and thus obstructs the movement of carriers so that to the performance of element is reduced. The research of OTFT focuses on how to form an active layer with organic semiconductor molecules of single crystal or large crystal. The method frequently used is to perform a surface treatment on the deposited organic semiconductor molecule. That is, an interlayer compatible to the crystal of organic semiconductor molecule is coated on the dielectric layer so as to improve the crystallization of the organic semiconductor molecular.

U.S. Pat. No. 6,433,359 discloses a method using a self-assembled monolayer (SAM) as the interlayer between organic semiconductor and dielectric layer. This method can make pattern in the interlayer only when the precursor can react with the dielectric layer. In this regard, the material of U.S. Pat. No. 6,433,359 has a limited choice, and the condition of the precursor reacting with the dielectric layer is not easily controlled. In addition, evaporation deposition is used for forming the interlayer of the U.S. Pat. No. 6,433,359 that the SAM is easily evaporated during the manufacturing process causing the same to have unstable quality.

Form the above description, the conventional process of OTFT has the following drawbacks:

1. The forming of interlayer in the conventional process of OTFT is complicated and time-consuming that the high manufacture cost of the conventional process is increased so as to reduce it commercial competitiveness.
2. The interlayer can be formed only when the precursor can react with the dielectric layer in the conventional process of OTFT, therefore the material of the interlayer has a limited choice, and the condition of the precursor reacting with the dielectric layer is not easily controlled.
3. The interlayer is formed by evaporation deposition so that the SAM is easily evaporated during the manufacturing process causing the same to have unstable quality.

SUMMARY OF THE INVENTION

It is a primary object of the invention to provide a process to improve carrier mobility of organic semiconductor by forming an interlayer of a specific polymer, that the process of the invention is simple and low-cost.

Another object of the invention is to provide a process to improve carrier mobility of organic semiconductor by coating a specific polymer as the interlayer thereof for enabling the coating condition to be easily controlled and the specific polymer to have more choices.

Yet, another object of the invention is to provide a process to improve carrier mobility of organic semiconductor having no evaporation during the process, so that the resulting organic semiconductor is stable, and thus the throughput yield and the stability of OTFT are both enhanced.

To achieve the abovementioned objects, the process to improve carrier mobility of organic semiconductor according to a preferred embodiment of the invention comprises the steps as following:

(a) forming a gate on a substrate;
(b) forming an insulator layer on both the substrate and the gate;
(c) coating polyimide on the insulator layer to form an interlayer;
(d) forming a active layer on the interlayer; and
(e) forming a source and a drain.

Moreover, the means for coating polyimide on the insulator layer to form an interlayer can be selected from one of the following: spin coating, inject printing, contact printing and plasma etching.

BRIEF DESCRIPTION OF THE DRAWINGS

The present invention can be more fully understood by reading the subsequent detailed description and examples with references made to the accompanying drawings, wherein.

DESCRIPTION OF THE PREFERRED EMBODIMENT

For your esteemed members of reviewing committee to further understand and recognize the fulfilled functions and structural characteristics of the invention, several preferable embodiments cooperating with detailed description are presented as the follows.

Figure 1A:
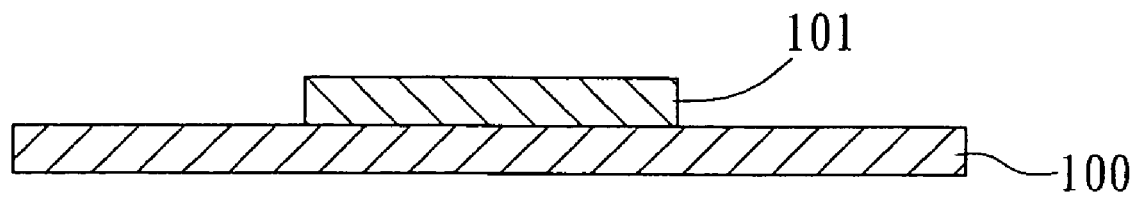
FIG. 1A to 1E are schematic diagrams of a process to improve carrier mobility of organic semiconductor according to a first preferred embodiment of the invention.

Please refer to FIG. 1A to FIG. 1E, which are schematic diagrams of a process to improve carrier mobility of organic semiconductor according to a first preferred embodiment of the invention. As seen in FIG. 1A, a substrate 100 is pre-processed and cleaned to remove tiny particles and organics thereon. Thereafter, a gate 101 of metal or conductive polymer such as Cr or ITO is formed on the substrate 100 which can be made of silicon wafer, glass, quartz, plastic or other flexible material.

Figure 1B:
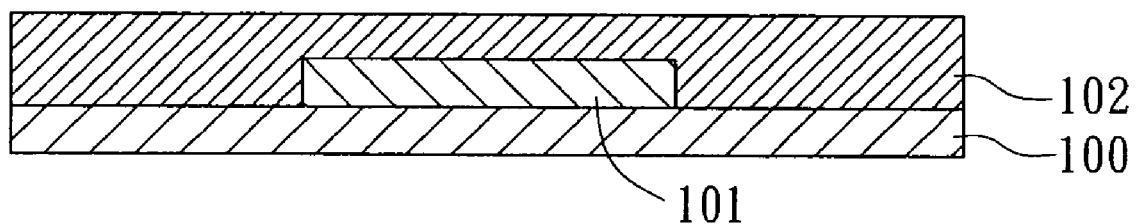
Figure 1C:
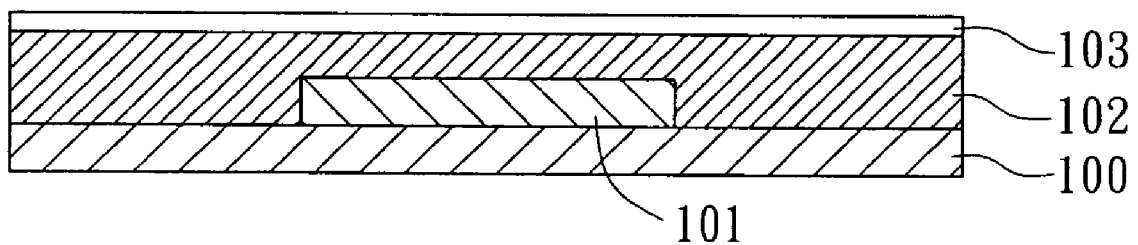

As shown in FIG. 1B, an insulator layer 102 is formed on the gate 101 and the substrate 100. The insulator 102 can be made of non-organic material, polymer or high-K material for insulating the OTFT.

Referring to 1C, an interlayer 103 of polyimide, such as Rn-1349 or RN-1338 of Nissan chemical industries, LTD., is formed on the insulator layer 102 by spin coating, inject printing, contact printing or plasma etching for enabling the organic molecules in the organic semiconductor can be orderly orientated in certain direction to increase the crystal size and decrease crystal boundary in the posterior procedures. Better carrier mobility is thus available, and leakage and crosstalk between pixels can be reduced to improve performance of the elements.

Figure 1D:
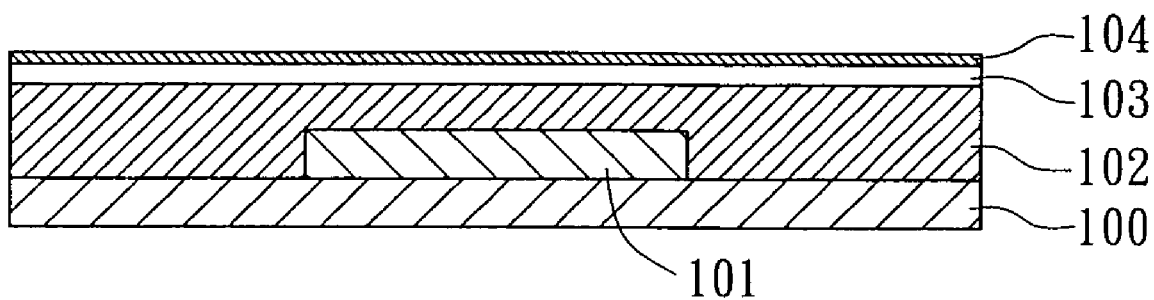

As shown in FIG. 1D, an active layer 104 is formed on the interlayer 103 by evaporation, spin coating, inject printing or contact printing. The crystal size of the active layer 104 is increased and the conductivity of the organic semiconductor is improved due to the addition of the interlayer 103. According to electrical analysis, the addition of the interlayer 103 will increase the crystal size of the active layer 104 (i.e. decrease the crystal boundary) and improve the carrier mobility from $0.01 \sim 0.02$ $cm^2/V$-s to $0.5 \sim 1.0$ $cm^2/V$-s.

Figure 1E:
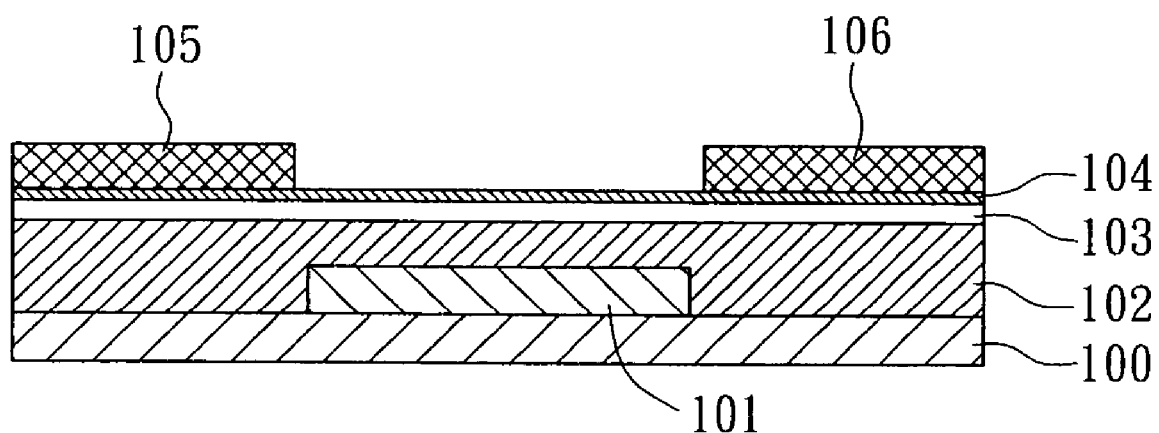

As shown in FIG. 1E, a source 105 and a drain 106 of metal or high conductive polymer, such as Cr or ITO, etc., are formed on the active layer 104. Thus, a top contact/bottom gate structure is completed.

Figure 2A:
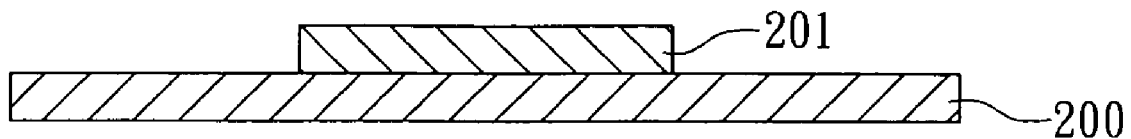
FIG. 2A to 2E are schematic diagrams of a process to improve carrier mobility of organic semiconductor according to a second preferred embodiment of the invention.
Figure 2B:
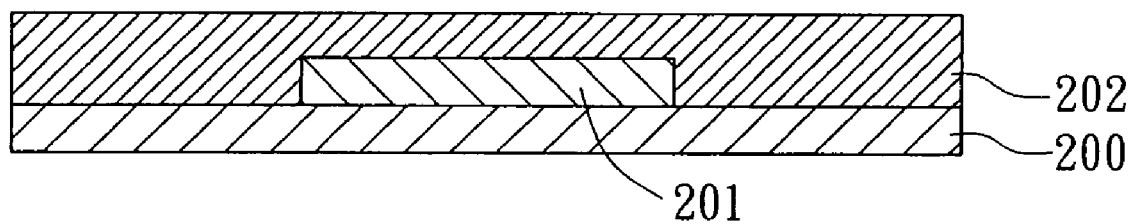

Please refer to FIGS. 2A to 2E, which are schematic diagrams of a process to improve carrier mobility of organic semiconductor according to a second preferred embodiment of the invention. As seen in FIG. 2A and FIG. 2B, a substrate 200, a gate 201 and an insulator layer 202 is formed by the same procedures and the same materials as those in the first preferred embodiment of FIG. 1A to 1C, and require no further description hereinafter.

Figure 2C:
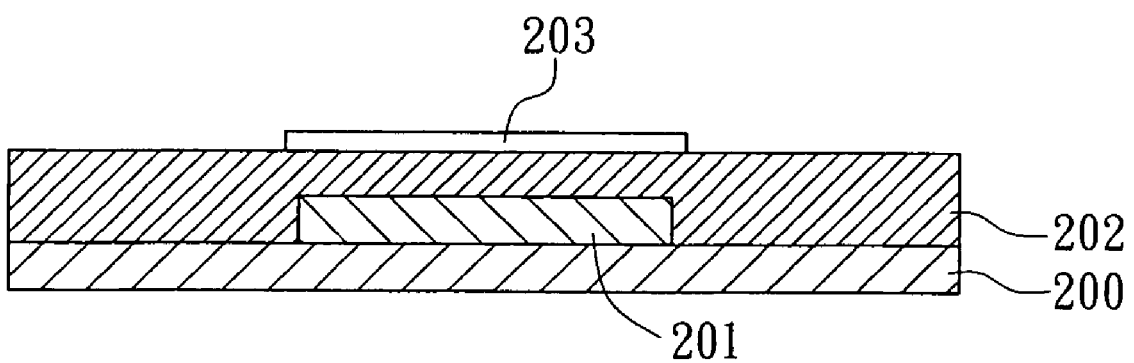
Figure 2D:
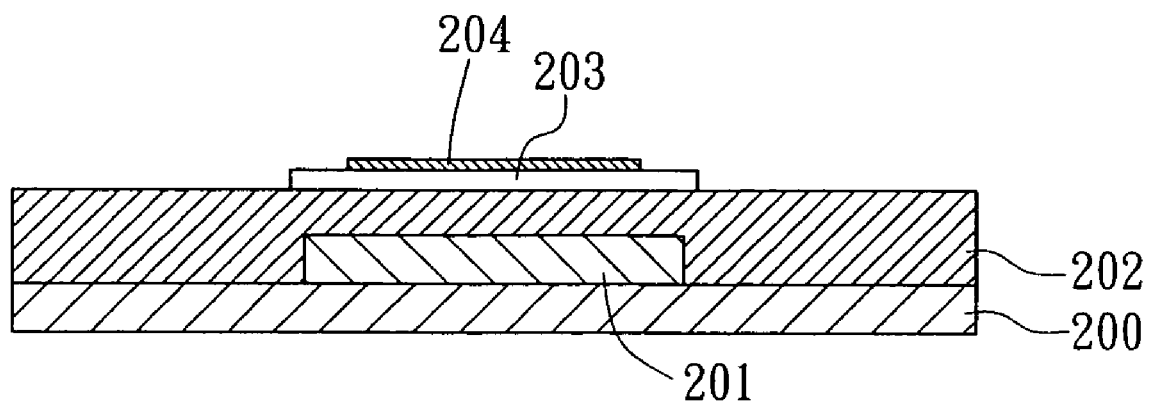
Figure 2E:
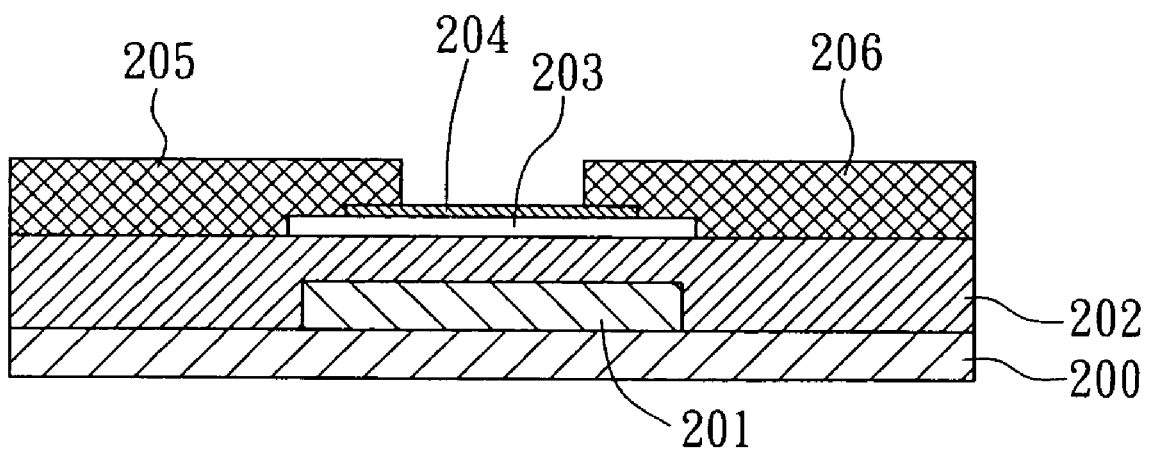

As shown in FIGS. 2C to 2E, an interlayer 203 of polyimide, such as Rn-1349 or RN-1338 of Nissan chemical industries, LTD., is coated on the insulator layer 202 by spin coating, inject printing, contact printing or plasma etching. In this preferred embodiment, the interlayer 203 is forming on the insulator layer without covering the whole insulator layer 202. Thereafter, an active layer 204, a source 205 and a drain 206 are formed respectively to constitute the top contact/bottom gate structure.

To sum up, the process to improve carrier mobility of organic semiconductor of the present invention employs a coating of a specific polymer as interlayer, such that the coating condition can be controlled easily, material of the interlayer can have more choices, and the process is simple and low-cost. In addition, the present invention has no evaporation during the process, so that the resulting organic semiconductor is stable. Although the structure of the embodiments is a top contact/bottom gate, the top contact/top gate, bottom contact/top gate or bottom contact/bottom gate structures, and so on, are also applicable.

While the preferred embodiment of the invention has been set forth for the purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. A process to improve carrier mobility of organic semiconductor, comprising the steps of:
   a) forming a gate on a substrate;
   b) forming an insulator layer on the substrate and the gate;
   c) coating polyimide on the insulator layer to form an interlayer, the interlayer improving the crystallization of the organic semiconductor;
   d) forming an active layer on the interlayer; and
   e) forming a source and a drain.

2. The process as claimed in claim 1, wherein the substrate is made of a material selected from the group consisting of silicon wafer, glass, quartz, plastic and other flexible materials.

3. The process as claimed in claim 1, wherein the gate, source and drain are made of a material selected from the group consisting of metal and conductive polymer.

4. The process as claimed in claim 1, wherein the insulator is made of a material selected from the group consisting of non-organic material, polymer and High-K material.

5. The process as claimed in claim 1, wherein the active layer is made of organic semiconductor material.

6. The process as claimed in claim 1, wherein the coating of polyimide on the insulator layer to form the interlayer is a method of plasma etching.

7. The process as claimed in claim 1, wherein forming of the active layer is a method of plasma etching.

8. An organic semiconductor comprising:
   a) a substrate;
   b) a gate formed on the substrate;
   c) an insulator layer formed on the gate and the substrate;
   d) a polyimide interlayer coated on the insulator layer;
   e) an active layer formed on the interlayer, the interlayer improving the crystallization of the organic semiconductor; and
   f) a source and a drain region formed on the active layer.

9. The organic semiconductor of claim 8, wherein the source and drain regions are formed on the active layer, the interlayer and the insulator layer.

10. The organic semiconductor of claim 8, wherein the substrate is made of a material selected from the group consisting of silicon wafer, glass, quartz, plastic and other flexible materials.

11. The organic semiconductor of claim 8, wherein the gate, source and drain are made of a material selected from the group consisting of metal and conductive polymer.

12. The organic semiconductor of claim 8, wherein the insulator is made of a material selected from the group consisting of non-organic material, polymer and High-K material.

13. The organic semiconductor of clam 8, wherein the active layer is made of organic semiconductor material.

14. The organic semiconductor of claim 8, wherein the polyimide interlayer is coated on the insulator layer by plasma etching.

15. The organic semiconductor of claim 8, wherein the active layer is formed on the interlayer by plasma etching.

* * * * *